(12) United States Patent
Jeanjean et al.

(10) Patent No.: US 6,954,119 B2
(45) Date of Patent: Oct. 11, 2005

(54) CASCADED ARRANGEMENT OF LOWER ORDER FILTERS AND METHOD OF DESIGNING THE SAME

(75) Inventors: François Jeanjean, Wemmel (BE); Geert Arthur Edith Van Wonterghem, Eeklo (BE)

(73) Assignee: Alcatel, Paris (FR)

( * ) Notice: Subject to any disclaimer, the term of this patent is extended or adjusted under 35 U.S.C. 154(b) by 135 days.

(21) Appl. No.: 10/337,781

(22) Filed: Jan. 8, 2003

(65) Prior Publication Data
US 2003/0155994 A1 Aug. 21, 2003

(30) Foreign Application Priority Data
Jan. 9, 2002 (EP) .............................. 02290045

(51) Int. Cl.$^7$ ............................................. H03H 7/00
(52) U.S. Cl. ....................................... 333/167; 333/138
(58) Field of Search ............................... 333/166, 167, 333/168, 172, 173, 174, 176, 138

(56) References Cited

U.S. PATENT DOCUMENTS

| | | | |
|---|---|---|---|
| 5,042,085 A | * 8/1991 | Errico | 455/43 |
| 5,097,235 A | * 3/1992 | Reichel | 333/167 |
| 5,256,997 A | * 10/1993 | Inagaki | 333/28 R |
| 5,963,112 A | 10/1999 | Moschytz | |
| 6,073,849 A | * 6/2000 | Colley et al. | 235/462.27 |
| 6,381,563 B1 | * 4/2002 | O'Riordan et al. | 703/14 |
| 6,476,685 B1 | * 11/2002 | Cheung | 333/28 R |

OTHER PUBLICATIONS

A. Zverev, Handbook of Filter Synthesis 1967, Wiley, pp. 44–50 and 73.*
N Sevastopoulos: "How to Design High Order Filtes with Stopband Notches Using the LTC1562 Quad Operational Filter (Part 1)" Linear Technology Magazine, 'Online! May 1, 1998, pp. 26–29, XP002201176.
K Kosbar: "Cascade Forms" 'Online! XP002201177, Nov. 1977.

* cited by examiner

Primary Examiner—Dean Takaoka
(74) Attorney, Agent, or Firm—Sughrue Mion, PLLC (57) ABSTRACT

A passive filter arrangement and a method of providing such a filter is described. The frequency response of the filter arrangement is substantially the same as the frequency response of a first filter of an order having a first value, the frequency response of the first filter being representable by a first set of one or more poles and/or one or more zeros. Descriptions of a plurality of second filters are generated, each second filter having an order lower than the order of the first value, each second filter having a frequency response representable by a one or more poles and/or one or more zeros, the one or more poles and/or one or more zeros of each lower order filter being a subset of the first set. The lower order filters are cascaded.

14 Claims, 6 Drawing Sheets

CASCADED ARRANGEMENT OF LOWER ORDER FILTERS AND METHOD OF DESIGNING THE SAME

FIELD OF THE INVENTION

The present invention relates to a higher order passive filter formed from a cascade of lower order passive filters and to a method for designing such a filter as well as to computer program products for designing such filters. More particularly, the present invention relates to a higher order filter constructed from a cascade of lower order filters whereby at least one of the lower order filters is a passive filter, e.g. a filter comprising discrete components such as resistors, capacitors and inductances.

BACKGROUND OF THE INVENTION

Figure 1:
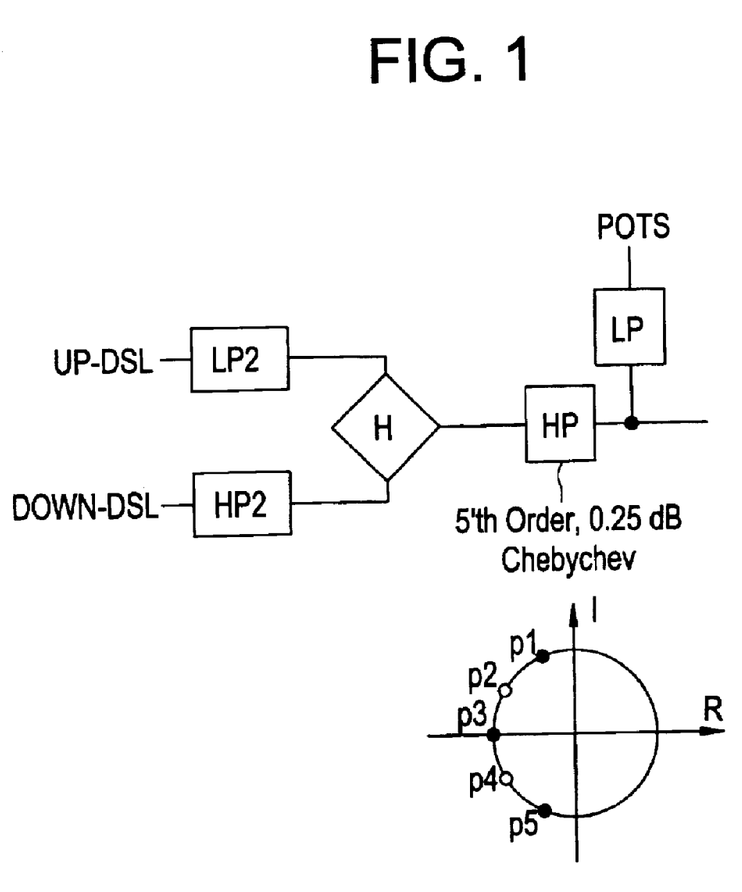
FIG. 1 is a schematic representation of an xDSL network and the pole-zero diagram of a fifth order Chebyshev filter.

Filters are used extensively in telecommunications networks. An example is shown in FIG. 1 for an xDSL service in which HP are high pass filters, LP are low pass filters, H is a hybrid circuit, POTS is a telephone network and UP-DSL and DOWN-DSL are representations of the uplink and down link transmission lines of the xDSL system. Line drivers such as Asymmetric Digital Subscriber Line (ADSL) drivers, Very High Speed Digital Subscriber Line (VSDL) drivers and others generally called in the art xDSL line drivers (where "x" represents the type of technology) are known.

It is known to design passive filters of any order. Generally, filter designs have been characterised into various "standard" filter types generally known by their original proponent such as Chebyshev, inverse Chebyshev, Butterworth, Bessel, Cauer (elliptic). These standard designs have recognisable and useful characteritics. A design engineer will select a particular type of filter depending upon the application. Standard tables of component values for such filter designs exist. Nowadays, user-friendly computer programs are available on the Internet for providing component values as well as characteristics of a selected filter design. The frequency response of a filter may be described by its transfer function $H(\omega)$, where $\omega$ represents $2\pi$ times the frequency. The transfer function may be represented by a reference analytic expression, e.g. the equation:

$$H(\omega) = K \frac{(j\omega + z_1)(j\omega + z_2) \ldots (j\omega + z_m)}{(j\omega + p_1)(j\omega + p_2) \ldots (j\omega + p_n)} \quad (1)$$

Where $(j\omega+z_m)$ are the zero factors and $(j\omega+p_n)$ are the pole factors of $H(\omega)$ and K is called the scale factor. Any finite zero or pole can be repeated. The poles and zeros define the frequency characteristic of a filter uniquely. They may be represented on a pole-zero diagram in the complex plane. Thus, on a pole zero diagram the poles and/or zeros for a particular standard design are located at certain predefined positions depending upon the order of the filter. The transfer function of standard filters is often defined by another type of reference analytic expression e.g. by polynomials $N(s_n)$ and $D(s_n)$:

$$H(\omega)=N(s_n)/D(s_n) \quad (2)$$

The frequency response of the filter depends on the coefficients of the polynomials $D(s_n)$ and/or $N(s_n)$. These coefficients are available from any filter handbook or CAD program and determine the location of the poles (i.e. the roots of $D(s_n)$) and/or the zeros (i.e. the roots of $N(s_n)$) in the s-plane. For example, the poles of a sixth-order Butterworth lowpass filter will lie on a semicircle about the origin in the left half plane and those of a Chebyshev filter will lie on an ellipse. A fifth order Chebyshev pole-zero diagram is shown schematically in FIG. 1.

Figure 2:
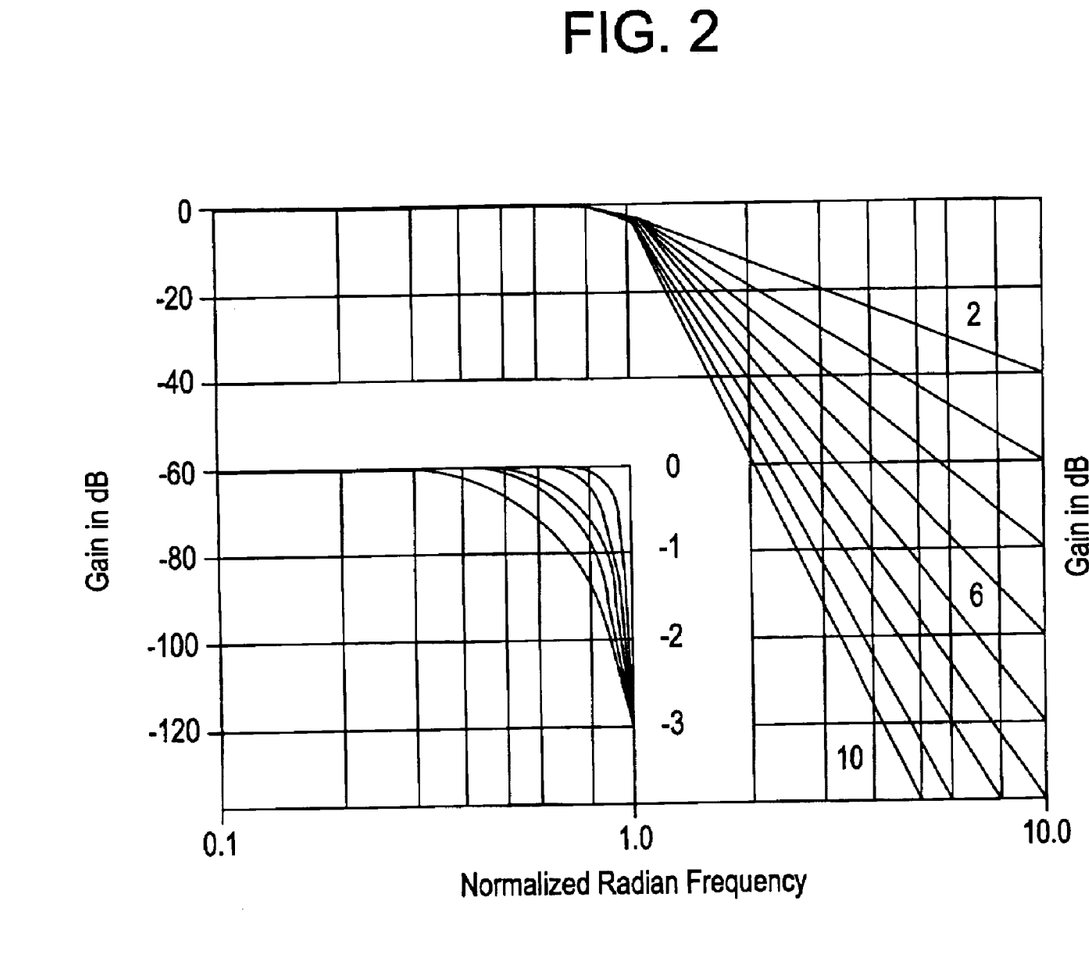
FIG. 2 shows the frequency response of a Butterworth filter of various orders.

Filters can be cascaded, that is arranged in series, in order to obtain a response which is the combination of the two filters. In this way a higher order filter may be obtained from a combination of lower order filters. An example, of how to design a cascaded filter arrangement is given in U.S. Pat. No. 5,963,112 the whole contents of which are incorporated by reference. However, when cascading is done, the characteristic of the higher order filter is not the same as when this higher order filter is designed as a single filter. For example, the combination of a cascade of a third and a second order Chebyshev filter does not have the same response as a fifth order Chebyshev filter. In fact, such a cascade has a poorer frequency response especially in the transition bands at the corner frequencies. As shown in FIG. 2, the response of a Butterworth filter in the transition band near the corner frequency changes with order number. For instance, a cascaded combination of a third and a second order Butterworth filter is inferior to a fifth order Butterworth filter as far as the roll-off with frequency above the corner frequency is concerned.

In designing filters, the filter designer is aware that component sensitivity increases with the filter order. The latter should therefore be held as low as possible consistent with the filter specifications. Also higher order passive filters are often bulky. These considerations favour cascading low order filters to obtain a higher order filter. However, as indicated above cascading standard lower order filters does not provide an optimum higher order filter.

Accordingly, a need exists for cascaded higher order filters and a method of designing higher order cascaded filters which provides good frequency response especially in the transition band at the corner frequencies.

A further need exists for higher order filters arrangements and a method of designing higher order filter arrangements which have less bulky components.

SUMMARY OF THE INVENTION

The present invention provides a method of providing a passive filter arrangement whose frequency response is substantially the same as the frequency response of a first filter of an order having a first value, the frequency response of the first filter being representable by a first set of one or more poles and/or one or more zeros, the method comprising the steps of: generating descriptions of a plurality of second filters, each second filter having an order lower than the order of the first value, each second filter having a frequency response representable by a one or more poles and/or one or more zeros, the one or more poles and/or one or more zeros of each lower order filter being a subset of the first set, and cascading the lower order filters directly or indirectly. At least one of the lower order second filters may be a passive filter. The second filters may be composed of discrete components such as resistors, inductors and capacitors. Alternatively, the second filters may be filters of the type which are representable by lumped circuits, e.g. describable by a combination of resistances, capacitances and/or inductances. At least one of the second filters may also be an active or a digital filter. The first filter may be a lowpass filter, bandpass filter, band-reject filter, highpass filter or a notch filter or similar. The description generation may be made using a computer system. In the determination of the design a library of predefined lower order filters may be used. For example, a set of predefined lower order passive, discrete component filters may be provided. The transfer functions and hence the poles and/or zeros of these filters are then obtained as a function of the discrete component values. Once the poles and/or zeros of the higher order filter have been partitioned into subsets, each subset is assigned to a selected one of the lower order filters. The component values for each selected lower order filter are then determined from the poles and/or zero of its assigned subset.

The present invention also includes a filter designed in accordance with the above method(s).

The present invention may also provide a passive filter arrangement whose frequency response is substantially the same as a filter of the type where the transfer function of the filter is definable as a reference analytic expression, e.g. a Chebyshev, Inverse Chebyshev, Butterworth, Elliptic, Bessel, Optimal, Parabolic, or similar filter whose frequency response is representable by a first set of one or more poles and/or one or more zeros, the passive filter arrangement comprising a direct or indirect cascade of second filters, each second filter having an order of value lower than the first value, the frequency, each second filter having a frequency response representable by a one or more poles and/or one or more zeros, the one or more poles and/or one or more zeros of each lower order filter being a subset of the first set. At least one of the lower order second filters may be a passive filter. The second filters may be composed of discrete components such as resistors, inductors and capacitors. Alternatively, the second filters may be filters of the type representable by lumped circuits, e.g. describable by a combination of resistances, capacitances and/or inductances. At least one of the second filters may be digital or an active filter. The first filter may be a lowpass filter, bandpass filter, band-reject filter, highpass filter or a notch filter. The passive filter arrangement may be advantageously used in telecommunications network such as an xDSL network.

The present invention also includes a computer program product comprising code segments which when executed on a computer may be used to generate a design of a plurality of cascaded filters and described above. The computer program product may be stored on any suitable storage device, e.g. a CD-ROM.

The present invention also includes a method for providing design parameters of a cascaded filter, comprising: transmitting from a far location a description of a desired filter to a near location where a processing engine carries out any method in accordance with the present invention to design a cascaded filter, and receiving at a far location at least one physical parameter related to the cascaded filter.

The invention will now be described with reference to the following drawings.

DETAILED DESCRIPTION OF THE INVENTION

The present invention will be described with reference to certain embodiments and drawings, but the present invention is not limited thereto but only by the attached claims. The present invention is particularly well suited for, but not limited to, designing discrete-component, cascaded, passive filters. It will become apparent to those skilled in the art that the present invention is not limited to any particular types of filters. The method of the present invention can be used to design, for example, lowpass filters, bandpass filters, band-reject filters, highpass filters and notch filters. In the following the present invention will be described with respect to Chebyshev filters, by way of example only. The method of the present invention can also be used to design specific types of filters, such as, for example but not limited to, Butterworth filters, Chebyshev filters, Inverse Chebyshev filters, Bessel filters, Optimal filters, Parabolic filters and Elliptic filters as well as to the design of customised filters which do not necessarily fall into any one of these classes. A definition of all these classes of filter may be summarized in that their transfer function is definable by a reference analytic expression, that is a reference mathematical analytic function. The reference analytic function is sometimes called a "prototype function" or a "paramaterized prototype function". Typically this function will be a polynomial. Generally, the polynomial will be separable into roots which may be poles and/or zeros of the frequency response in the complex plane. Hence, the reference analytic functions are generally defined in terms of frequency. The description of such standard filters may be found in reference works such as "Handbook of filter synthesis", Anatol I. Zverev, John Wiley & Sons, 1967. The present invention is also not limited to any particular order filter and the method of the present invention can be used to design filters of any order.

In accordance with an aspect of the present invention, a passive filter arrangement is designed whose filter characteristics approach that of a desired higher order passive filter. The higher order filter is assumed to have a transfer function which may be defined by a suitable representation, e.g. by coefficients of $D(s_n)$ and/or $N(s_n)$, which can be represented by, or be transformed into, one or more poles and/or one or more zeros. The arrangement is formed by cascading of two or more lower order filters, whereby each lower order filter has a transfer function which can be defined by a suitable representation such as by coefficients of polynomials $D(s_n)$ and/or $N(s_n)$ which can be represented by, or transformed into, zeros and/or poles which form a subset of the zeros and/or poles of the higher order filter. At least one of the lower order filters is preferably a passive filter. The freedom to partition the sub-sets among the lower order filters in any manner allows design variations which can be used to optimize the design, e.g. to reduce component size and sensitivity.

Such a cascaded filter may be designed as follows in accordance with a first embodiment. Firstly, the transfer function of the higher order filter to be designed is determined, e.g. in the form of poles and/or zeros from suitable filter specifications (e.g. from a filter handbook or CAD program) or are calculated from first principles, or are calculated from the coefficients of the polynomial(s) $D(s_n)$ and/or $N(s_n)$ for the type of filter. Then, the poles and/or zeros are partitioned into m subsets for a filter arrangement of m cascaded lower order filters. The subsets need not be all of the same order, in fact, in general they will be of different orders. For each subset of poles and/or zeros, a lower order filter is designed, that is, for example, a suitable arrangement of discrete components such as capacitors, resistors and/or inductors is selected. Alternatively, the second filters may be filters representable by lumped circuits, e.g. composed of resistances, capacitances and/or inductances. Theoretical values for these components are then selected so that the lower order filter has a transfer function having the poles and/or zeros of its subset. In accordance with an embodiment of the present invention this may be achieved by the following method.

Firstly, a set of designs of lower order passive filters using discrete components is produced, e.g. second, third and fourth order filters. Alternatively, these filters may be filters representable by lumped circuits, e.g. composed of resistances, capacitances and/or inductances. For each one of these filters the transfer function is defined analytically in terms of the component values. From these equations, mathematical relationships between the poles and/or zeros and the component values can be defined. Thus a library of known lower order filters is constructed and stored on a suitable storage medium, e.g. a hard disk of a computer, in machine readable and electronically accessible form. For a specific higher order filter which is to be designed as a cascade of lower order filters, the poles and/or zeros are determined. Then the poles and/or zeros of this higher order filter are partitioned among a plurality of lower order filter designs selected from the library, each lower order filter having one subset. Thus, subsets of the poles and/or zeros are formed, each subset being assigned to one lower order filter selected from the library. Using the mathematical relationships linking poles and/or zeros of the lower order filters with the component values, each subset of poles and/or zeros is transformed into a physical design, e.g. into component values of the discrete components of each lower order filter.

Once the theoretical values for the components of each lower order filter are obtained, suitable standard components may be selected which come closest to these theoretical values. Optionally, once these practical values for components of the lower order filters have been obtained the overall performance of the cascaded filter may be determined, e.g. either analytically or by finite difference methods or by using a standard program such as SPICE. The performance of the final arrangement can then be compared with the desired higher order filter. If the design does not appear optimum, other component values may be selected, or if this is not sufficient a different partitioning of the poles and/or zeros of the higher order filter among the lower order filters can be tried.

The above method creates a filter using passive lower order filters. The present invention is not limited thereto. A further embodiment of the present invention will now be described. Firstly, it is assumed that the library of designs of lower order passive filters using discrete components or describable by lumped circuit analysis has been created as described for the previous embodiment. For a specific higher order filter the poles and/or zeros are again determined and partitioned among a plurality of lower order filter designs. However, in this case not all the lower order filters to be cascaded are selected from a library of passive filters. Only one or more but not all are so selected. Thus, subsets of the poles and/or zeros of the higher order filter are formed, each subset being assigned to one lower order filter of which some are selected from the library of passive filters. Using the mathematical relationships linking poles and/or zeros of the lower order filters with the component values, each subset of poles and/or zeros assigned to these filters is transformed into component values of the discrete components of each lower order filter. The remaining filter or filters are selected as active and/or digital filters. For these remaining filters the relevant design procedures for active or digital filters are applied in order to create the relevant lower order filters with the specified subsets of poles and/or zeros remaining from the partitioning. For the design of active and digital filters, see for example, "Electronic filter analysis and synthesis", Michael G. Ellis, Artech House, Inc., 1994; "Design of Analog Integrated Circuits and Systems", Kenneth R. Laker, Willy M. C. Sansen, McGraw Hill Inc., 1994; as well as computer software packages such as SIFILSYN; Snelgrove, MATLAB that compute transfer functions (poles and zeros) from specifications.

Once the theoretical values for the components of each lower order filter are obtained, suitable standard components may be selected which come closest to these theoretical values. Optionally, once these practical values for components of the lower order filters have been obtained the overall performance of the cascaded filter may be determined, e.g. either analytically or by finite difference methods, for example. The performance of the final arrangement can then be compared with the desired higher order filter. If the design does not appear optimum, other component values may be selected, or if this is not sufficient a different partitioning of the poles and/or zeros of the higher order filter among the lower order filters can be attempted.

Figure 3:
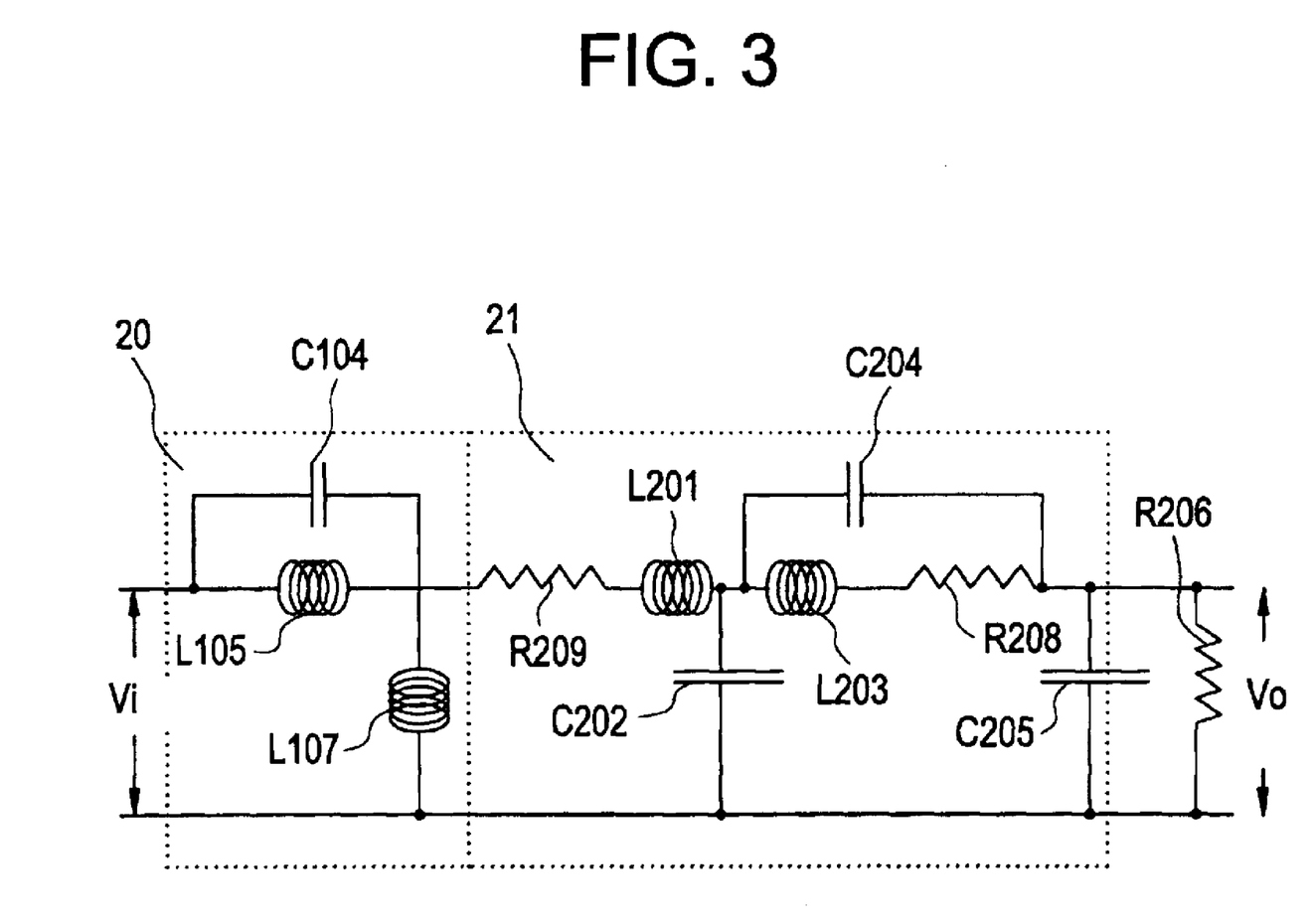
FIG. 3 shows a Chebyshev filter arrangement of fifth order comprising cascaded second and third order filters in accordance with an embodiment of the present invention.

An example of a combination of a design of a fifth order Chebyshev high-pass filter combined with a low-pass Elliptic filter will now be described in which notches are created. The Chebyshev filter had five poles and five zeros. These poles and zeros are now partitioned among two lower order filters—a second order (two poles and two zeros) and a third order filter (remaining poles and zeros). The second order filter (20) is shown in FIG. 3 using discrete components cascaded with the fourth order elliptic filter 21. The component values are:

C204=$820 \times 10^{-12}$ farad
L203=$330 \times 10^{-6}$ henry
R208=15 ohms
C104=$4.7 \times 10^{-9}$ farad
L105=$1 \times 10^{-3}$ henry
L107=$820 \times 10^{-6}$ henry
R206=860 ohms
L201=$470 \times 10^{-6}$
C202=$1.8 \times 10^{-9}$ farad
R209=82 ohms
C205=$6.8 \times 10^{-10}$ farad.

Figure 4:
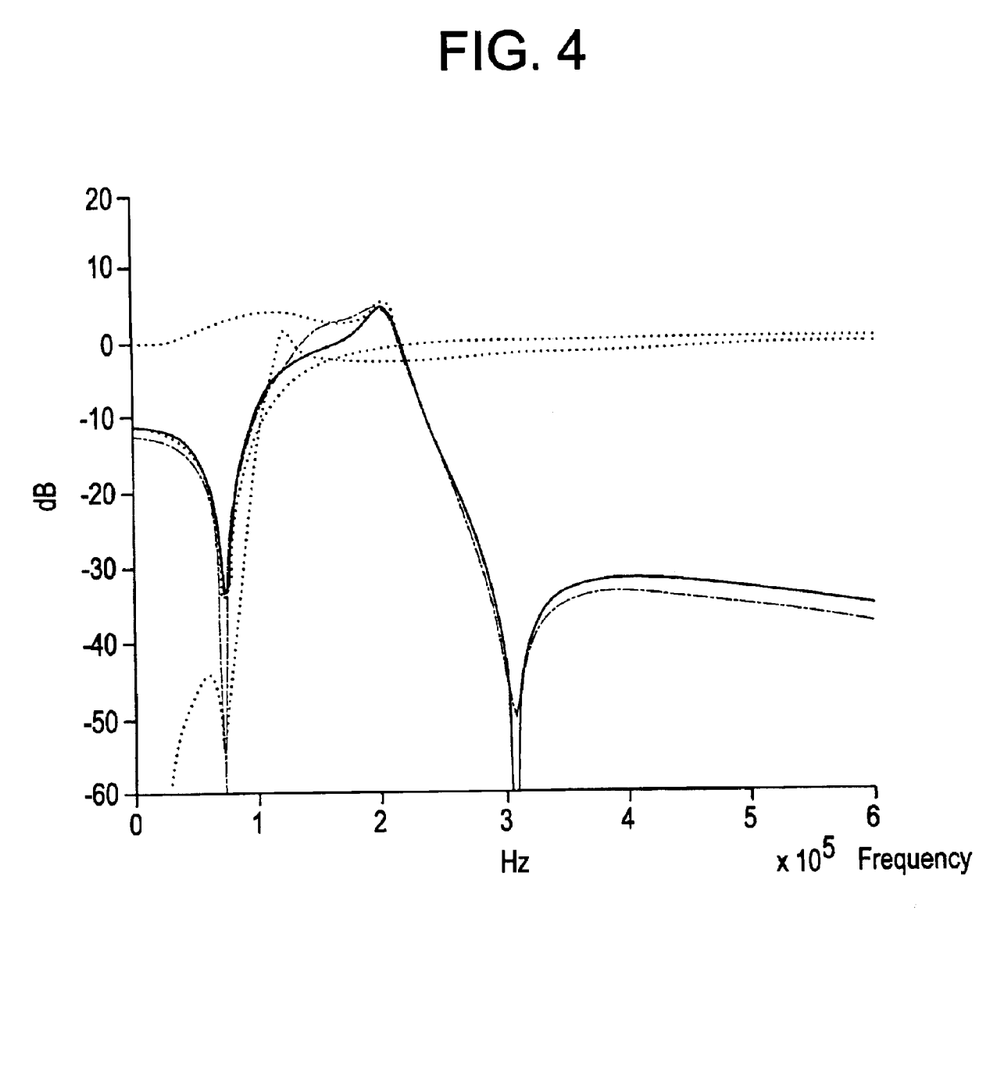
FIG. 4 provides a comparison between the frequency response of a fifth order Chebyshev and the frequency response of the cascaded filters of FIG. 3. The solid line represents the fifth order filter and the dotted line the cascaded filters.

A comparison of the theoretical frequency response for this combination and the cascade of second order filter 20 and the third order filter 21 is shown in FIG. 4, showing the notches. The theoretical curve is shown as a solid line and the cascaded filter as the dotted line. A good agreement is obtained. The remaining third order filter (not shown) may be placed at a different part of the network. Thus, the cascade of the two lower order filters (here the second and third order filters which make up the fifth order Chebyshev) need not be adjacent to each other (direct cascade) but may be cascaded across the network (indirect cascade).

In the above description the cascade of lower order filters comprises passive filters made from discrete components or describable by lumped circuit analysis. In accordance with the present invention, at least one of the lower order filters is a passive filter. Other lower order filters may be digital or active filters.

Figure 5:
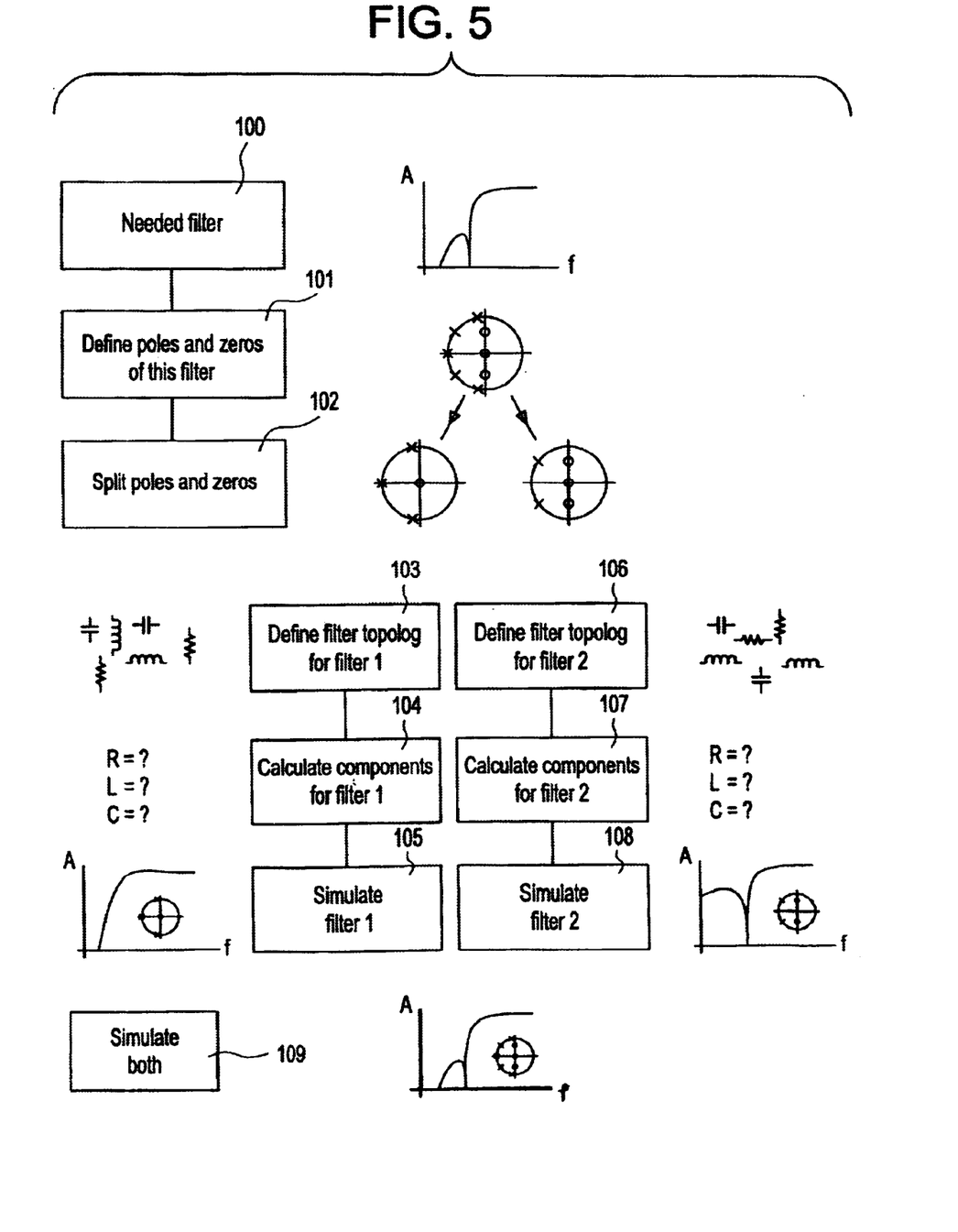
FIG. 5 is a flow diagram of a method as implementable as a computer program product in accordance with an embodiment of the present invention.

With reference to FIG. 5 a generalized flow diagram is shown for a method of designing a cascaded filter in accordance with an embodiment of the present invention. In step 100, a passive filter design is selected. In step 101 the poles and/or zeros of this filter are determined. In step 102 the poles and/or zeros are split into a number of subsets. In step 103, the topology of a first lower order filter is defined, e.g. a passive, an active or a digital filter. This may be done by selecting a filter design from a library. Alternatively, the design may be created by means of a graphical user interface of a computer. Typically, this design will comprise discrete components or may be described by lumped circuit analysis. For examples, resistors, capacitors and inductors may be drawn on the display screen of a computer with the relevant connections therebetween. Then a computer program running on the computer retrieves the design as displayed and determines the analytical transfer function using standard lumped-circuit analysis. A subset of poles and/or zeros is then assigned to this filter and the component values determined in step 104 based on the relationship between the poles and/or zeros and the component values determined in step 103. Optionally, the performance of the resulting lower order can be calculated (e.g. by simulation) and displayed in step 105. The remaining filter or filters are selected as passive, active or digital filters. For these remaining filters the relevant design procedures for active or digital filters are applied in order to create the relevant lower order filters with the specified subsets of poles and/or zeros remaining from the partitioning as indicated in steps 106 and 107. The design performance of the lower order filter may then be optionally simulated in step 108. Finally, the cascade of the filters may be optionally simulated and displayed in step 109.

The present invention also includes a computer program product which may be used to design cascaded filter arrangements in accordance with the present invention when executed on a suitable computer. The calculation procedure for determining the component values based on the subset of poles and/or zeros of the higher order filter has been written for Matlab. A flow diagram for such a program has been shown in FIG. 5. Alternatively, the computer program product according to the present invention may be provided as a dedicated computer program, e.g. on a suitable storage medium such as a CD-ROM. The computer program may use the library of lower order filters mentioned above, e.g. it may be able to call the relevant analytic functions associated with each design of filter.

Figure 6:
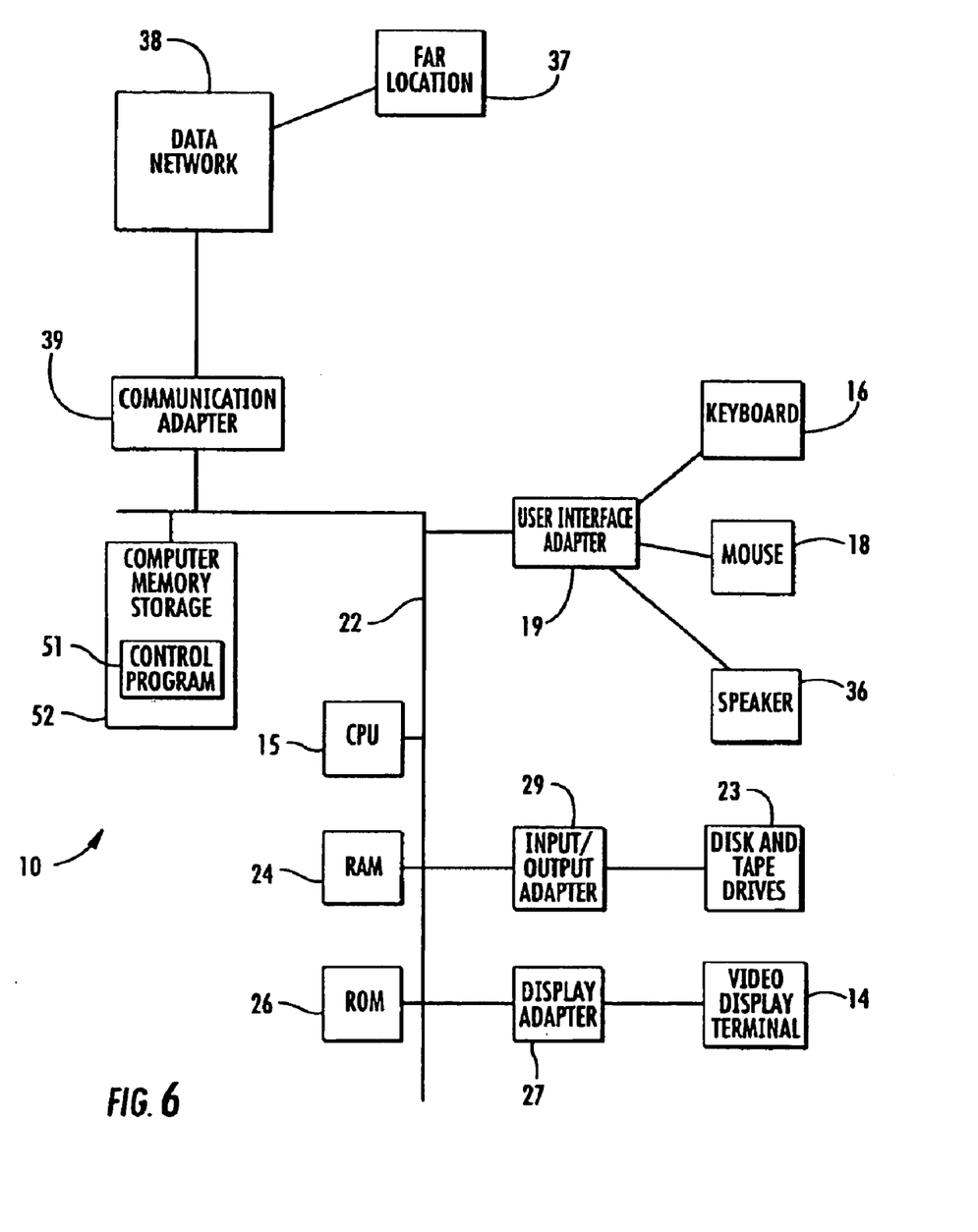
FIG. 6 is a schematic representation of a computer system which may be used with the present invention.

FIG. 6 is a schematic representation of a computing system which can be utilized with the methods and in a system according to the present invention. A computer 10 is depicted which may include a video display terminal 14, a data input means such as a keyboard 16, and a graphic user interface indicating means such as a mouse 18. Computer 10 may be implemented as a general purpose computer, e.g. a UNIX workstation.

Computer 10 includes a Central Processing Unit ("CPU") 15, such as a conventional microprocessor of which a Pentium III processor supplied by Intel Corp. USA is only an example, and a number of other units interconnected via system bus 22. The computer 10 includes at least one memory. Memory may include any of a variety of data storage devices known to the skilled person such as random-access memory ("RAM"), read-only memory ("ROM"), non-volatile read/write memory such as a hard disc as known to the skilled person. For example, computer 10 may further include random-access memory ("RAM") 24, read-only memory ("ROM") 26, as well as an optional display adapter 27 for connecting system bus 22 to an optional video display terminal 14, and an optional input/output (I/O) adapter 29 for connecting peripheral devices (e.g., disk and tape drives 23) to system bus 22. Video display terminal 14 can be the visual output of computer 10, which can be any suitable display device such as a CRT-based video display well-known in the art of computer hardware. However, with a portable or notebook-based computer, video display terminal 14 can be replaced with a LCD-based or a gas plasma-based flat-panel display. Computer 10 further includes user interface adapter 19 for connecting a keyboard 16, mouse 18, optional speaker 36. Bus 22 may be connected via a communication adapter 39 for connecting computer 10 to a data network 38 such as the Internet, an Intranet a Local or Wide Area network (LAN or WAN) or a CAN. This allows transmission of a representation of a higher order filter to be transmitted over a telecommunications network, e.g. entering a description of the filter at a far location 37 and transmitting it to a near location, e.g. via the Internet, where a processor such as computer 10 carries out a method in accordance with the present invention and returns parameters relating to the cascaded filter design to a far location 37, e.g. by e-mail. Hence, the present invention contemplates that a service may be provided which is accessible from the Internet or from a Local Area or Wide Area network, whereby a suitable computer program product is loaded onto a server (represented here by computer 10) accessible from the Internet, a LAN or a WAN. Values representative of a higher order filter which is desired are entered at a remote location (optionally including the number of filters in the cascade of the filter arrangement to be designed) as well as the type of filter, e.g. Chebyshev. This data is transferred to the server via a telecommunications network 38. On the server the values for a cascade of filters are determined by executing a computer program product according to the present invention and the results returned to the inquirer at the remote location 37, optionally with a comparison of the frequency response of the higher order filter and the cascaded filter which has been designed.

Computer 10 also includes a graphical user interface that resides within machine-readable media to direct the operation of computer 10. Any suitable machine-readable media may retain the graphical user interface, such as a random access memory (RAM) 24, a read-only memory (ROM) 26, a magnetic diskette, magnetic tape, or optical disk (the last three being located in disk and tape drives 23). Any suitable operating system and associated graphical user interface (e.g., Microsoft Windows) may direct CPU 15. In addition, computer 10 includes a control program 51 which resides within computer memory storage 52. Control program 51 contains instructions that when executed on CPU 15 carry out the operations described with respect to any of the methods of the present invention.

Those skilled in the art will appreciate that the hardware represented in FIG. 6 may vary for specific applications. For example, other peripheral devices such as optical disk media, audio adapters, or chip programming devices, such as PAL or EPROM programming devices well-known in the art of computer hardware, and the like may be utilized in addition to or in place of the hardware already described.

In the example depicted in FIG. 6, the computer program product (i.e. control program 51, e.g. the Matlab program described above) can reside in computer storage 52. In addition, the library of lower order filter designs may be stored in suitable non-volatile electronic storage means which is accessible by the CPU 15. However, it is important that while the present invention has been, and will continue to be, that those skilled in the art will appreciate that the mechanisms of the present invention are capable of being distributed as a program product in a variety of forms, and that the present invention applies equally regardless of the particular type of signal bearing media used to actually carry out the distribution. Examples of computer readable signal bearing media include: recordable type media such as floppy disks and CD ROMs and transmission type media such as digital and analogue communication links.

While the invention has been shown and described with reference to preferred embodiments, it will be understood by those skilled in the art that various changes or modifications in form and detail may be made without departing from the scope and spirit of this invention.

What is claimed is:

1. A method of providing a filter arrangement whose frequency response is substantially the same as the frequency response of a first filter of an order having a first value, the frequency response of the first filter being representable by a first set of one or more poles and/or one or more zeros, the method comprising the steps of: generating descriptions of a plurality of second filters, each second filter having an order lower than the order of the first value, each second filter having a frequency response representable by one or more poles and/or one or more zeros, the one or more poles and/or one or more zeros of each lower order filter being a subset of the first set, and cascading the lower order filters, wherein the subsets of poles and zeros of the cascaded second filters constitute all the poles and zeros of the first filter.

2. A method according to claim 1, wherein at least one of the second filters is a passive filter.

3. A method according to claim 1, wherein the second filters are composed of discrete components or are describable by lumped circuit analysis.

4. A method for providing design parameters of a cascaded filter, comprising: transmitting from a far location a description of a desired higher order filter to a near location where a processing engine carries out a method in accordance with claim 1, and receiving at a far location at least one physical parameter related to the cascaded filter.

5. A method according to claim 1 wherein the first filter is a lowpass filter, bandpass filter, band-reject filter, highpass filter or a notch filter.

6. A computer program product comprising code segments which when executed on a computer generate a design of a plurality of cascaded filters described in accordance with the method of claim 1.

7. A computer program product according to claim 6, stored on a data carrier.

8. A filter arrangement whose frequency response is substantially the same as that of a first filter of an order having a first value and whose transfer function is definable as a reference analytic expression, and whose frequency response is representable by a first set of one or more poles and/or one or more zeros, the passive filter arrangement comprising a cascade of second filters, each second filter having an order of value lower than the first value, each second filter having a frequency response representable by one or more poles and/or one or more zeros, the one or more poles and/or one or more zeros of each lower order second filter being a subset of the first set, wherein the subsets of poles and zeros of the cascaded second filters constitute all the poles and zeros of the first filter.

9. The arrangement according to claim 8, wherein at least one of the lower order second filters is a passive filter.

10. The arrangement according to claim 8, wherein the first filter is a lowpass filter, bandpass filter, band-reject filter, highpass filter or a notch filter.

11. The arrangement according to claim 8, wherein the passive filter arrangement is in a telecommunications network such as an xDSL network.

12. The arrangement according to claim 8, wherein the second filters are composed of discrete components or are describable by lumped circuit analysis.

13. The arrangement according to claim 8, wherein said first filter is selected from the group consisting of Chebyshev, Inverse Chebyshev, Butterworth, Elliptic, Bessel, Optimal and Parabolic filters.

14. The arrangement according to claim 8, wherein said reference analytic expression is a reference mathematical analytic function.

* * * * *